(12) United States Patent
Poon et al.

(10) Patent No.: US 9,088,399 B1
(45) Date of Patent: Jul. 21, 2015

(54) CIRCUIT AND METHOD FOR TESTING JITTER TOLERANCE

(71) Applicant: Xilinx, Inc., San Jose, CA (US)

(72) Inventors: Leo Kar Leung Poon, San Jose, CA (US); David L. Ferguson, Campbell, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/171,523

(22) Filed: Feb. 3, 2014

(51) Int. Cl.
*H04B 1/38* (2006.01)
*H04L 7/00* (2006.01)
*H04L 1/24* (2006.01)
*H04L 7/033* (2006.01)

(52) U.S. Cl.
CPC .............. *H04L 7/0054* (2013.01); *H04L 1/243* (2013.01); *H04L 7/033* (2013.01)

(58) Field of Classification Search
CPC  G01R 31/31709; H04L 1/205; H04L 7/0331; H04L 1/24; H04L 1/243; H04B 17/00
See application file for complete search history.

(56) References Cited

U.S. PATENT DOCUMENTS

| | | | |
|---|---|---|---|
| 6,441,602 B1* | 8/2002 | Eckhardt et al. | 324/76.53 |
| 6,825,730 B1* | 11/2004 | Sun | 331/16 |
| 8,228,972 B2* | 7/2012 | Tonietto et al. | 375/221 |
| 8,878,580 B1* | 11/2014 | Gaskins et al. | 327/156 |
| 2005/0193290 A1* | 9/2005 | Cho et al. | 714/710 |
| 2009/0105978 A1* | 4/2009 | Schuttert et al. | 702/69 |
| 2010/0001755 A1* | 1/2010 | Weizman et al. | 324/765 |
| 2010/0026314 A1* | 2/2010 | Schuttert | 324/555 |
| 2010/0097071 A1* | 4/2010 | Lee et al. | 324/537 |
| 2013/0162279 A1* | 6/2013 | Achkir et al. | 324/756.02 |
| 2014/0098843 A1* | 4/2014 | Kong et al. | 375/219 |

OTHER PUBLICATIONS

Savoj, Jafar, "Wideband Flexible-Reach Techniques for a 0.5-16.3Gb/s Fully-Adaptive Transceiver in 20nm CMOS", IEEE Custom Integrated Circuits Conference, Sep. 2014, 4 pages.

* cited by examiner

*Primary Examiner* — Kenneth Lam
(74) *Attorney, Agent, or Firm* — LeRoy D. Maunu

(57) ABSTRACT

A transceiver circuit for self-test of jitter tolerance is disclosed. The transceiver circuit includes a transmitter circuit having an output coupled to an output terminal of the transceiver and a receiver circuit having in input coupled to an input terminal of the transceiver. The transceiver also includes a loopback path configured to provide a signal transmitted by the transmitter circuit to the input of the receiver circuit. The transceiver also includes a test control circuit that causes jitter to be introduced in the signal transmitted by the transmitter circuit when the test control circuit is operating in a self-test mode, but not when the test control circuit is operating in a non-test mode.

18 Claims, 8 Drawing Sheets

CIRCUIT AND METHOD FOR TESTING JITTER TOLERANCE

FIELD OF THE INVENTION

The disclosure generally relates to data communications, and more particularly to testing jitter tolerance of communication circuits.

BACKGROUND

Most integrated circuits are susceptible to signal jitter. Jitter refers to the deviation in, or displacement of, some aspect of the pulses of a digital signal such as frequency, signal amplitude, or phase of a signal. In high-speed communications, jitter present in a transmitted signal can make it difficult to properly sample and decode the signal at a receiver. For instance, if significant jitter is present in the clock signal used by a transmitter to coordinate transmission of symbols, a receiver may not be able to determine the clock signal used for transmission.

Jitter tolerance is a widely used measurement technique to predict the overall performance of a receiver. Jitter tolerance determines the maximum amount of jitter that can be presented at the receiver input without causing the receiver to incorrectly interpret the incoming data. High speed protocols/standards, such as XAUI and PCI Express, specify a maximum amount of jitter that may be present and therefore must be tolerated by receivers. Such protocols/standards may specify individual tolerances for different types of jitter, such as random jitter (RJ), sinusoidal jitter (SJ) or periodic jitter (PJ), duty-cycle distortion (DCD), inter-symbol interference (ISI), and/or bounded uncorrelated jitter (BUJ). Some protocols may also specify different jitter tolerances for various frequency ranges (e.g., jitter tolerance mask).

Due to the multiple types of jitter that may be specified by a protocol, jitter tolerance has typically been tested using a rack having several different test devices for introducing different types of jitter for tolerance testing. The most basic jitter tolerance testing equipment injects SJ by connecting an arbitrary waveform generator (AWG) to the delay port of a data generator, and ISI jitter is injected manually by connecting different trace lengths at the output of the data generator. This approach lacks flexibility, is labor intensive and is difficult to apply to multi-channel data collection. In recent years, equipment vendors have integrated different jitter injection capability into one piece of equipment (e.g., Agilent J-BERT). This approach allows a user to inject different types of jitter at amounts specified by the user. However, one limitation of this approach is that the cost per channel is extremely high (~$300 K/channel for 40 Gbs). In addition to the significant costs, most high speed bench equipment has an upper data rate limit and may not be capable of testing jitter tolerance for higher data rate products (e.g., 28 Gbs).

SUMMARY

A transceiver circuit for self-test of jitter tolerance is disclosed. The transceiver circuit includes a transmitter circuit having an output coupled to an output terminal of the transceiver and a receiver circuit having an input coupled to an input terminal of the transceiver. The transceiver also includes a loopback path configured to provide a signal transmitted by the transmitter circuit to the input of the receiver circuit. The transceiver also includes a test control circuit that causes jitter to be introduced in the signal transmitted by the transmitter circuit when the test control circuit is operating in a self-test mode, but not when the test control circuit is operating in a non-test mode.

A method is also disclosed for testing jitter tolerance of a transceiver. Using a transmitter circuit of the transceiver, jitter is introduced in a test signal provided to an input of the transmitter and the test signal is transmitted on an output of the transceiver. The test signal is provided from the output of the transceiver to an input of the transceiver. Using a receiver circuit of the transceiver, the test signal provided to the input of the transceiver is processed. The receiver is monitored to determine if the introduced jitter caused an error in the processing of the test signal.

Other features will be recognized from consideration of the Detailed Description and Claims, which follow.

BRIEF DESCRIPTION OF THE DRAWINGS

Various aspects and features of the disclosed methods and systems will become apparent upon review of the following detailed description and upon reference to the drawings in which.

DETAILED DESCRIPTION OF THE DRAWINGS

Circuits and methods are disclosed for testing jitter thresholds of transceiver circuits. As indicated above, high-speed test equipment that generates jitter for threshold testing is expensive. The disclosed transceiver circuits include test circuits capable of performing self-tests of jitter thresholds without the use of expensive external equipment to induce jitter for testing. In one example, a transceiver circuit includes a transmitter circuit, a receiver circuit, and a loopback path configured to provide a signal transmitted by the transmitter circuit to an input of the receiver circuit. The transceiver also includes a test control circuit that causes jitter to be introduced in the signal transmitted by the transmitter circuit when the test control circuit is operating in a self-test mode. The test control circuit does not cause jitter to be introduced in the signal when the test control circuit is operating in a non-test mode. In some implementations, the test control circuit monitors the receiver to determine whether or not the induced jitter causes the receiver to operate incorrectly.

Use of the transmitter of the transceiver to generate jitter for testing provides a very low cost mechanism for testing of jitter thresholds. Further, as jitter is provided by the transmitter of the transceiver, jitter thresholds may be tested for all data rates that are supported by the transceiver.

Figure 1:
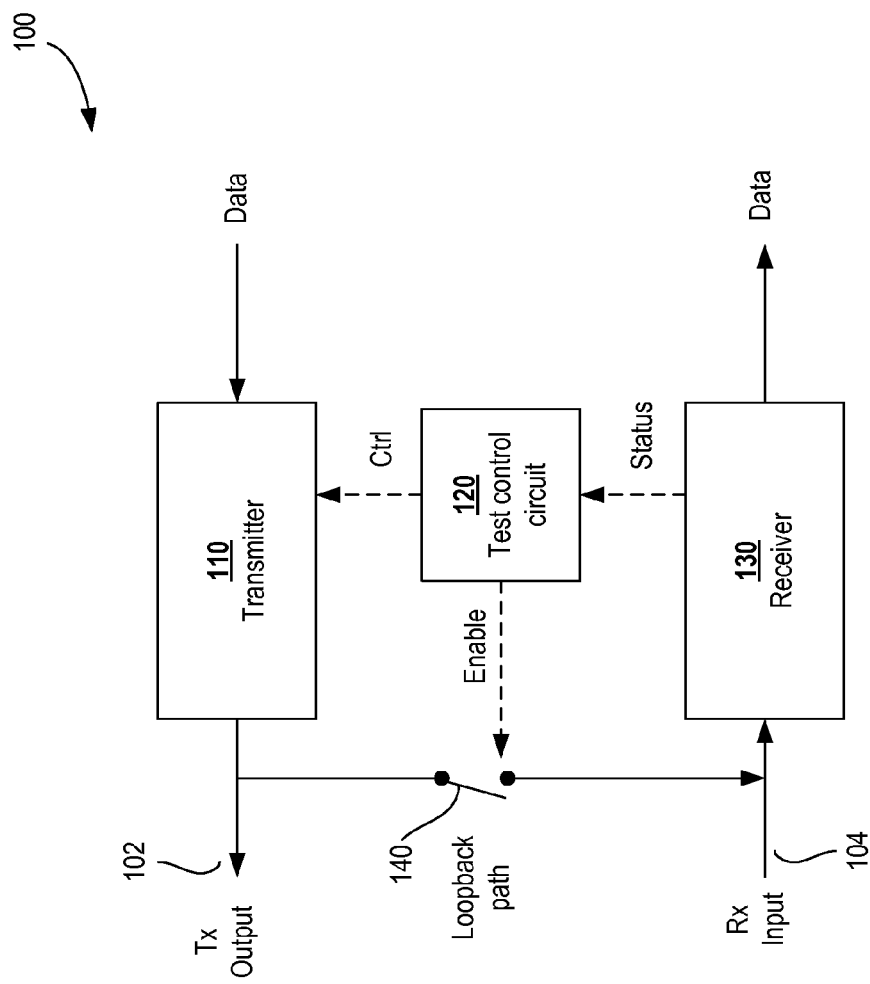
FIG. 1 shows a block diagram of a first transceiver having circuitry for testing jitter tolerance of a receiver.

Turning now to the figures, FIG. 1 shows a block diagram of a first transceiver having circuitry for testing jitter tolerance of a receiver. The transceiver 100 includes a transmitter circuit 110 for transmitting signals on an output terminal 102 (Tx output) and a receiver circuit 130 having an input coupled to receive signals at an input terminal 104 (Rx input). The transceiver 100 also includes a loopback path 140 that provides a signal from the Tx output to the Rx input when enabled.

The transceiver 100 includes a test control circuit 120 for testing jitter tolerance of the transceiver. When operating in a self-test mode, the test control circuit 120 introduces jitter in a signal transmitted by the transmitter circuit 110 by adjusting one or more parameters of the transmitter. In addition, the test control circuit 120 also enables the loopback path 140 to provide the signal from the Tx output 102 to the Rx input 104. When the test control circuit 120 is operating in a non-test mode, the loopback path 140 is disabled and the transmitter circuit 110 is operated so jitter is not introduced in the transmitted signal.

In this example, the test control circuit 120 also monitors a status of the receiver circuit 130 to determine whether or not the jitter introduced into the signal causes the receiver to process the signal in error. Alternatively, the status/output of the receiver circuit 130 may be monitored by a circuit (not shown) that is external to the transceiver to determine whether or not the jitter introduced into the signal causes the receiver to incorrectly process the signal.

In some implementations, the test control circuit 120 provides the signal (data) to the transmitter circuit 110, while operating in the test mode. Alternatively, the signal (data) may be provided by a circuit (not shown) that is external to the transceiver. In some implementations, a test circuit (not shown) external to the transceiver provides a test signal to the transmitter and also monitors the status/output of the receiver to determine whether or not the jitter introduced into the signal causes the receiver to process the signal in error. For ease of explanation, the examples disclosed herein are primarily discussed with reference to test control circuits, which provide the test signal to the transmitter for transmission, and which also monitor the status/output of the receiver.

Figure 2:
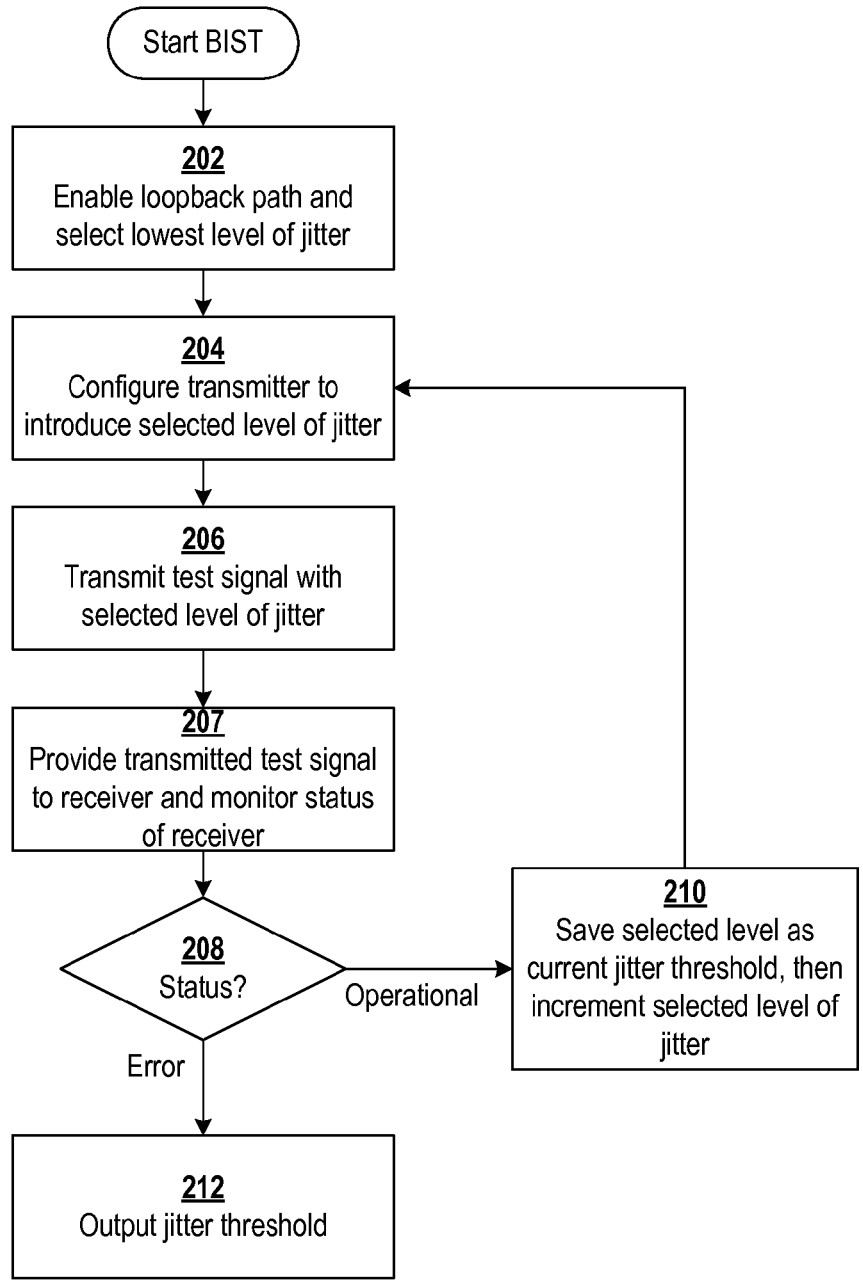
FIG. 2 shows a process for determining jitter tolerance of a receiver.

In some implementations, the test control circuit is configured to determine a jitter threshold of the receiver by determining a maximum amount of jitter that does not cause the receiver to operate in error. FIG. 2 shows an example process for determining jitter tolerance of a receiver. At block 202, the loopback path is enabled by a test control circuit and a first low level of jitter is selected. At block 204, the transmitter is configured to induce the selected level of jitter in transmitted signals. At block 206, test signals are transmitted with the selected level of jitter. At block 207, the transmitted signal is provided to a receiver of the transceiver using the loopback path. At block 207, the receiver is also monitored to determine if an error has occurred. If the status is operational at decision block 208, block 210 directs the process to save the selected level as the current jitter threshold and increment the selected level jitter. The process steps at blocks 204 and 206 are then repeated. The process continues in this manner until the receiver status indicates an error at decision block 208. If the status indicates an error at decision block 208, the last jitter level saved as the jitter threshold is output at block 212.

The test control circuit may cause the transmitter to induce jitter into a transmitted signal by adjusting a number of different parameters that affect operation of the transmitter. In some implementations, jitter is introduced in the signal by adjusting one or more parameters of a phase interpolation circuit of the transmitter. Jitter may also be introduced by adjusting pre-emphasis and/or post-emphasis (pre/post emphasis) performed on the transmitted signal by the transmitter. Jitter may also be introduced in the transmitted signal by adding jitter to one or more signals used by the transmitter. For example, jitter may be added to a clock signal used to clock the transmitter by adjusting a phase locked loop (PLL) that provides the clock signal to the transmitter. Jitter in the clock signal provided to the transmitter causes variation in the phase of the signal transmitted by the transmitter. As another example, jitter may be introduced in the transmitted signal by adding jitter to a supply voltage used to power the transmitter. Jitter in the supply voltage causes variation in amplitude and rise and fall times of the transmitted signal.

A test control circuit may adjust the various parameters discussed above, alone or in combination, to introduce various types of jitter. TABLE 1 shows various adjustments that may be performed to introduce different types of jitter. For each of the above discussed parameters that may be adjusted, TABLE 1 includes a respective row indicating the ability to introduce different types to jitter (indicated in respective columns) by adjusting the respective parameter.

TABLE 1

|  | RJ | BUJ | SJ/PJ | DCD | ISI |
| --- | --- | --- | --- | --- | --- |
| Phase interpolation | Yes, via clock sensitivity | Yes | Yes | Limited | Yes |
| PLL | FBDIV, CP, Loop filter, etc | No | No | w/ design mod | No |
| Pre/post emphasis | No | No | No | w/ design mod | Yes |
| Power supply | Yes | Yes | Yes | No | No |

As shown in the first row of TABLE 1, a phase interpolation circuit may be adjusted to introduce bounded uncorrelated jitter (BUJ), sinusoidal/periodic jitter (SJ/PJ), inter-symbol interference (ISI) type jitter, and to a limited extent duty-cycle distortion (DCD) type jitter. For instance, the Virtex7 programmable IC series by XILINX™ includes a transmitter having a phase interpolation circuit that may adjust or shift the phase of a transmitted signal by up to two unit intervals (UIs) with 128 increments digitally controlled by a 7 bits port. Some phase interpolation circuits may also introduce random jitter (RJ) in response to fluctuations of a clock network used to drive the transmitter. Phase interpolation circuits may exhibit different sensitivities to variation of the clock network.

As shown in the second row of TABLE 1, a PLL used to clock the transmitter may be adjusted to introduce RJ in the transmitted signal. Variation in the clock signal provided by the PLL will cause the transmitter to introduce jitter in the transmitted signal. Different implementations may adjust various parameters of the PLL to introduce jitter in a clock signal provided by the PLL including, for example, feedback divider, output divider, and reference divider settings, charge pump current and biases, loop filter function, and/or open loop gain of the PLL. These parameters may be adjusted to vary the magnitude and frequency range of the jitter in the clock signal.

In some implementations, design modifications may also be made to cause the PLL to introduce DCD type jitter. For instance, different PLLs may be used to provide different jitter magnitudes. As described in more detail with reference to FIG. 6, if multiple PLLs are available in the transceiver, different PLLs may be selected to clock the transmitter to provide different ranges of jitter. In some implementations, DCD type jitter may be introduced by adjusting a duty-cycle correction circuit of a PLL. During normal operation, the duty-cycle correction circuit will correct any DCD type jitter at the PLL clock. Conversely, the duty-cycle correction circuit can be adjusted to introduce DCD type jitter.

As shown in the third row of TABLE 1, a pre/post emphasis may be used to introduce ISI type jitter. ISI type jitter is caused by losses of the channel and other physical mechanism in the lane. Pre and post emphasis can be employed to change the rise and fall time of the end channel signal and in turn increase and decrease the ISI magnitude. During normal operation, the pre/post emphasis will improve/sharpen both the rising edge and falling edge of the signal to reduce ISI magnitude. In some implementations, design modifications may also be made to cause a pre/post emphasis circuit to introduce DCD type jitter. For instance, DCD type jitter may be introduced by making rising edges arrive early while leaving the falling edges unchanged.

As shown in the last row of Table 1, jitter of a power supply voltage, used to power the transmitter, may be increased to introduce RJ, BUJ, and/or SJ/PJ. Jitter in the supply voltage may cause variation in amplitude and rise and fall times of the transmitted signal. Changes in the supply voltage may also make circuits more susceptible to exhibiting RJ.

Figure 3:
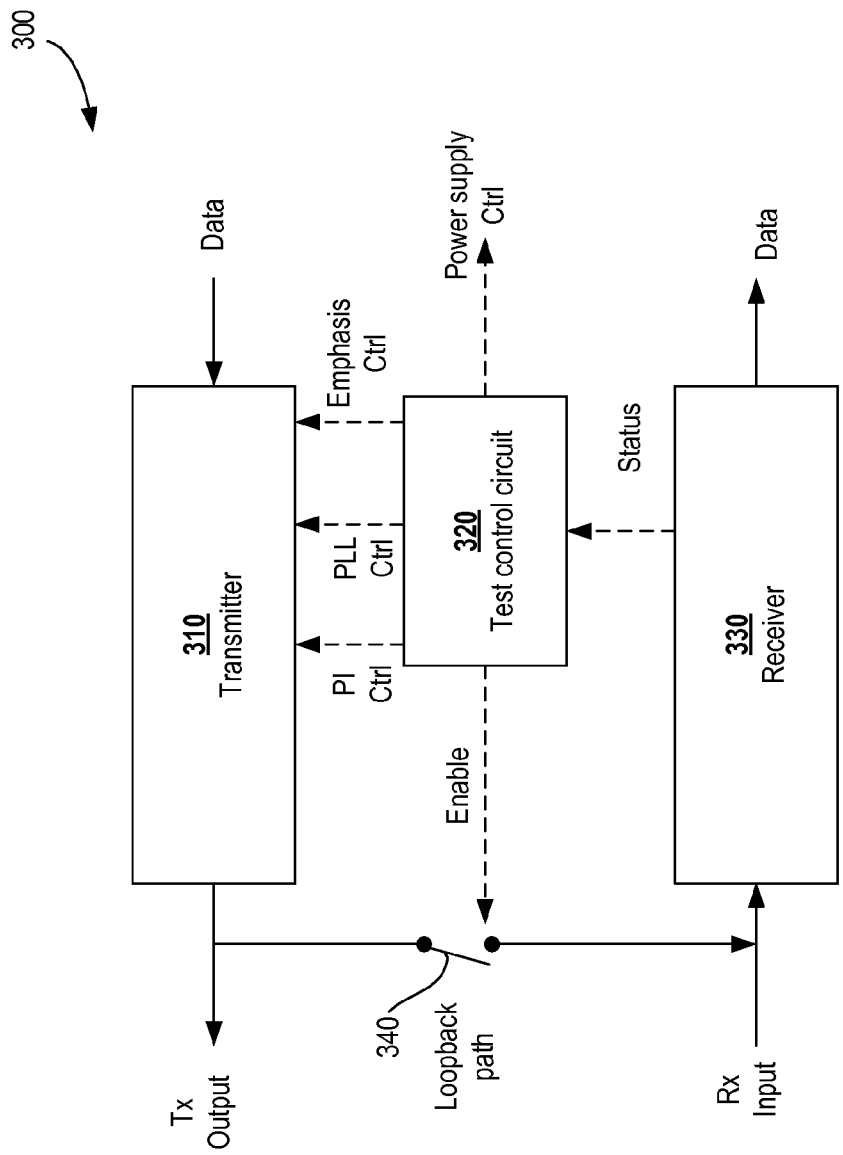
FIG. 3 shows a block diagram of a second transceiver having circuitry for testing jitter tolerance of a receiver.

FIG. 3 shows a block diagram of a second transceiver having circuitry for testing jitter tolerance of a receiver. Similar to the transceiver 100 shown in FIG. 1, transceiver 300 includes a transmitter circuit 310, a receiver circuit 330, and a loopback path 340 that provides a signal from the output of the transmitter circuit 310 to the input of the receiver circuit 330 when enabled. The transceiver 300 also includes a test control circuit 320 configured to introduce jitter in a signal transmitted by the transmitter circuit 310. When operating in a self-test mode, the test control circuit 320 enables the loopback path 340 and adjusts one or more parameters of the transmitter circuit 310 to introduce jitter into the transmitted signal. The test control circuit 320 also monitors a status of the receiver circuit 330 while operating in the self-test mode to determine whether or not the jitter causes an error in the receiver.

In this example, the test control circuit 320 is configured to introduce jitter by adjusting four parameters of the transmitter, as discussed with reference to TABLE 1. Phase interpolation settings of the transmitter are adjusted using a first control signal (PI Ctrl). PLL settings/configuration are adjusted using a second control signal (PLL Ctrl). Pre/post emphasis settings are adjusted using a third control signal (Emphasis Ctrl). Jitter in a power supply voltage is adjusted using a fourth control signal (Power Supply Ctrl). The PI Ctrl, PLL Ctrl, Emphasis Ctrl, and Power Supply Ctrl may be adjusted by the test control circuit to introduce different types of jitter, alone or in combination.

Figure 4:
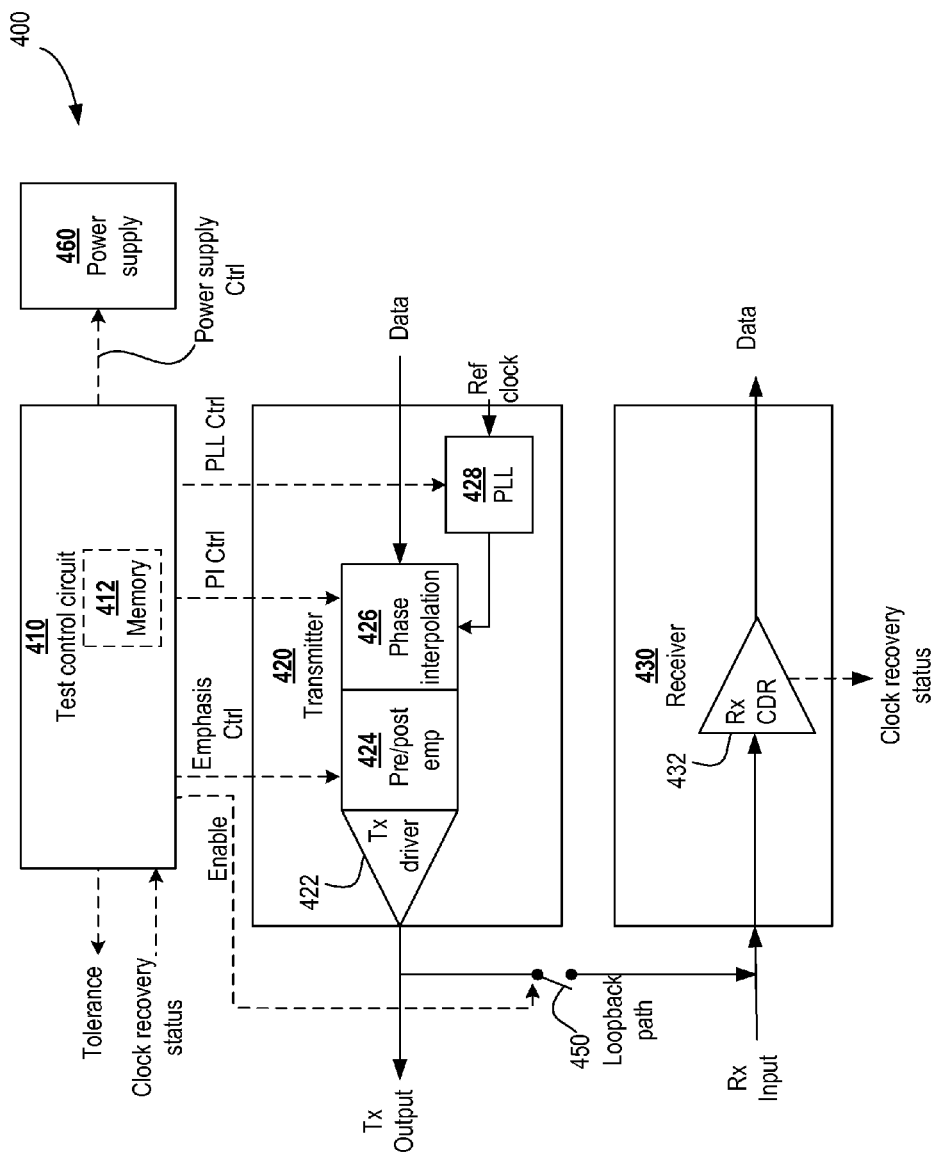
FIG. 4 shows a block diagram of a third transceiver having circuitry for testing jitter tolerance of a receiver.

FIG. 4 shows a block diagram of a third transceiver having circuitry for testing jitter tolerance of a receiver. Similar to the transceiver 300 shown in FIG. 3, transceiver 400 includes a transmitter circuit 420, a receiver circuit 430, and a loopback path 450 that provides a signal from the output of the transmitter circuit 420 to the input of the receiver circuit 430 when enabled. The transceiver also includes a test control circuit 410. When operating in a self-test mode, the test control circuit 410 enables the loopback path 450 and adjusts one or more parameters of the transmitter circuit 420 to introduce jitter into a transmitted signal.

In this example, the transmitter circuit 420 includes a phase interpolation circuit 426 and a pre/post emphasis circuit 424 for processing a signal (data) input to the transmitter. The transmitter circuit 420 also includes a driver circuit 422 for transmitting the processed signal on an output (Tx output) of the transceiver. The test control circuit 410 may introduce jitter in the transmitted signal by adjusting the configuration/settings of the phase interpolation circuit 426. In some implementations, control vectors indicated by control signal PI ctrl may be stored, for example, in a memory 412 of the test control circuit 410. As discussed with reference to the test control circuit 320 in FIG. 3, the test control circuit 410 may also introduce jitter in the transmitted signal by adjusting the configuration/settings of the pre/post emphasis circuit 424 using the emphasis ctrl signal, by adjusting the configuration/settings of the PLL circuit 428 using the PLL ctrl signal, or by jitter of a power supply 460 using a power supply ctrl signal.

While operating in the self-test mode, the test control circuit 410 also monitors a status/output of the receiver, to determine whether or not the jitter causes an error in the receiver circuit 430. In this example, the test control circuit 410 monitors the clock recovery status of a clock and data recovery circuit 432 included in the receiver. In some implementations, the test control circuit 410 may additionally or alternatively monitor other circuits and/or output of the receiver circuit 430 to determine if an error has occurred.

Figure 5:
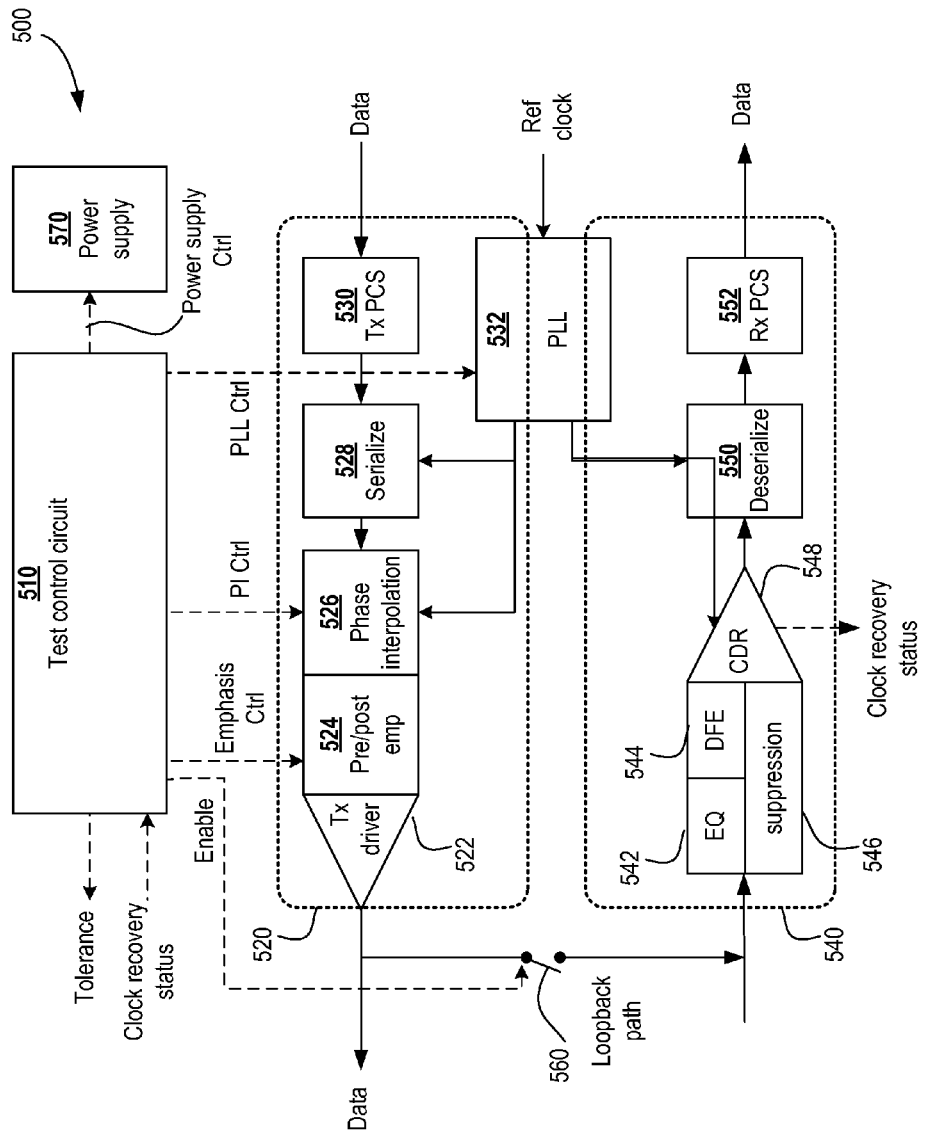
FIG. 5 shows a block diagram of a fourth transceiver having circuitry for testing jitter tolerance of a receiver.

In some implementations, the transmitter and receiver circuits may include additional circuits for performing various processing tasks as shown in FIG. 5. FIG. 5 shows a block diagram of a fourth transceiver having circuitry for testing jitter tolerance of a receiver. Similar to the transceiver 400 shown in FIG. 4, transceiver 500 includes a transmitter circuit 520, a receiver circuit 540, and a loopback path 560 that provides a signal from the output of the transmitter circuit 520 to the input of the receiver circuit 540 when enabled. The transceiver 500 also includes a test control circuit 510 configured to induce jitter in a transmitted signal. As described with reference to test control circuit 410 in FIG. 4, when operating in a self-test mode, the test control circuit 510 enables the loopback path 560 and adjusts one or more parameters of the transmitter circuit 520 to introduce jitter into a transmitted signal.

In this example, the test control circuit 510 also monitors the status of the receiver circuit 540 to determine whether or not the jitter causes an error in the receiver. The transmitter circuit 520 includes a pre/post emphasis circuit 524, a phase interpolation circuit 526, and driver circuit 522, similar to the transmitter 420 shown in FIG. 4. In this example, the transmitter circuit 520 also includes a physical coding sub-layer (PCS) circuit 530 for encoding data symbols for transmission. The transmitter circuit 520 also includes a serializer circuit 528 configured to convert data from a parallel to a serial format for transmission. The test control circuit 510 may introduce jitter in the transmitted signal by adjusting the configuration/settings of the phase interpolation circuit 526, by adjusting the configuration/settings of the pre/post emphasis circuit 524, by adjusting the configuration/settings of the PLL circuit 532, or by jitter of a power supply 570.

The receiver circuit 540 includes a clock and data recovery circuit 548 as described with reference to receiver 430 in FIG. 4. The receiver circuit 540 may also include a number of pre-processing circuits that process the signal before it is processed by the clock and data recovery circuit 548. For instance, in this example, the receiver includes a linear equalization circuit (EQ) 542, a decision feedback equalizer (DFE) 544, and a suppression circuit 546 for conditioning the input signal. These components may assist to remove jitter from received signals. The receiver circuit 540 may also include a number of post-processing circuits. In this example, the receiver circuit 540 includes a deserializer circuit 550 configured to convert received data from a serial format to a parallel format. The receiver circuit 540 also includes a physical coding sub-layer (PCS) circuit 552 for decoding received symbols.

In the example shown in FIG. 5, the transceiver includes a single PLL circuit 532 that is used to clock both the transmitter circuit 520 and the receiver circuit 540. In some implementations, the transmitter circuit 520 and the receiver circuit 540 may be clocked using different PLLs.

Figure 6:
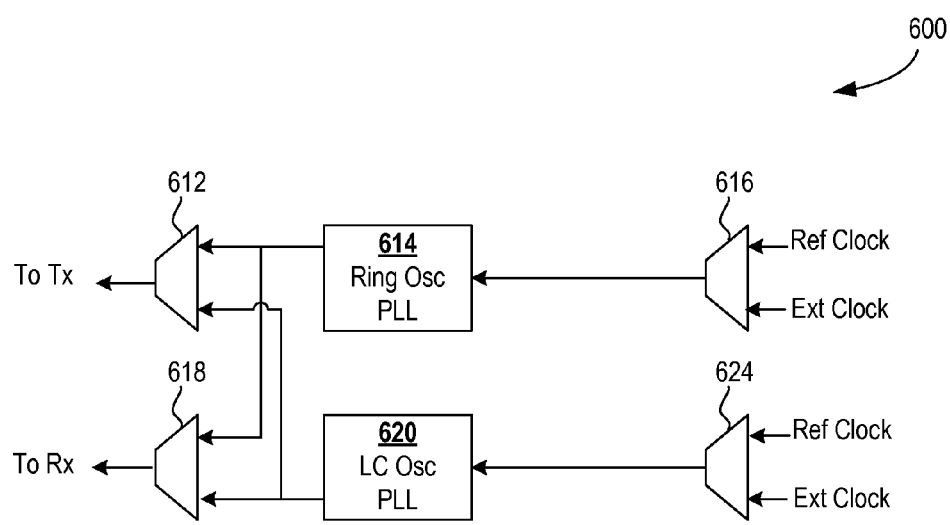
FIG. 6 shows a block diagram of an example phase-locked-loop circuit.

In some implementations, the transceiver includes multiple PLL circuits that may be used to provide a clock signal to the transmitter and receiver circuits. Different PLLs may exhibit different magnitudes of maximum jitter. FIG. 6 shows a block diagram of a phase-locked-loop circuit that may be used in connection with one or more of the disclosed circuits. In this example, the PLL circuit 600 includes a first ring oscillator type PLL 614 and a second inductor-capacitor (LC) oscillator type PLL 620. For each of the two PLLs, a respective multiplexor 616 and 624 is configured to select a clock used by the PLL as a reference. In this example, the multiplexors may each select one of two reference clocks including an internal reference clock and an external clock. The selection of a reference clock may depend on the requirements of the particular application or design in which the transceiver is incorporated.

The PLL circuit 600 also includes two multiplexors 612 and 618 for selecting a PLL clock output to provide to a transmitter (Tx) and to a receiver (Rx). A first output multiplexor 612 is configured to receive a clock from each of the PLL circuits 614 and 620 and provide a selected one of the two clocks to the transmitter. A second output multiplexor 618 is configured to receive the clock from each of the PLLs 614 and 620 and provide a selected one of the two clocks to the receiver. The selection of the PLL clock may be performed to select different jitter magnitudes. As an illustrative example, the ring oscillator type PLL 614 may exhibit random jitter in the range of 1-1.5 ps RJrms and the LC oscillator type PLL 620 may exhibit random jitter in the range of 0.5-0.8 ps RJrms.

Figure 7:
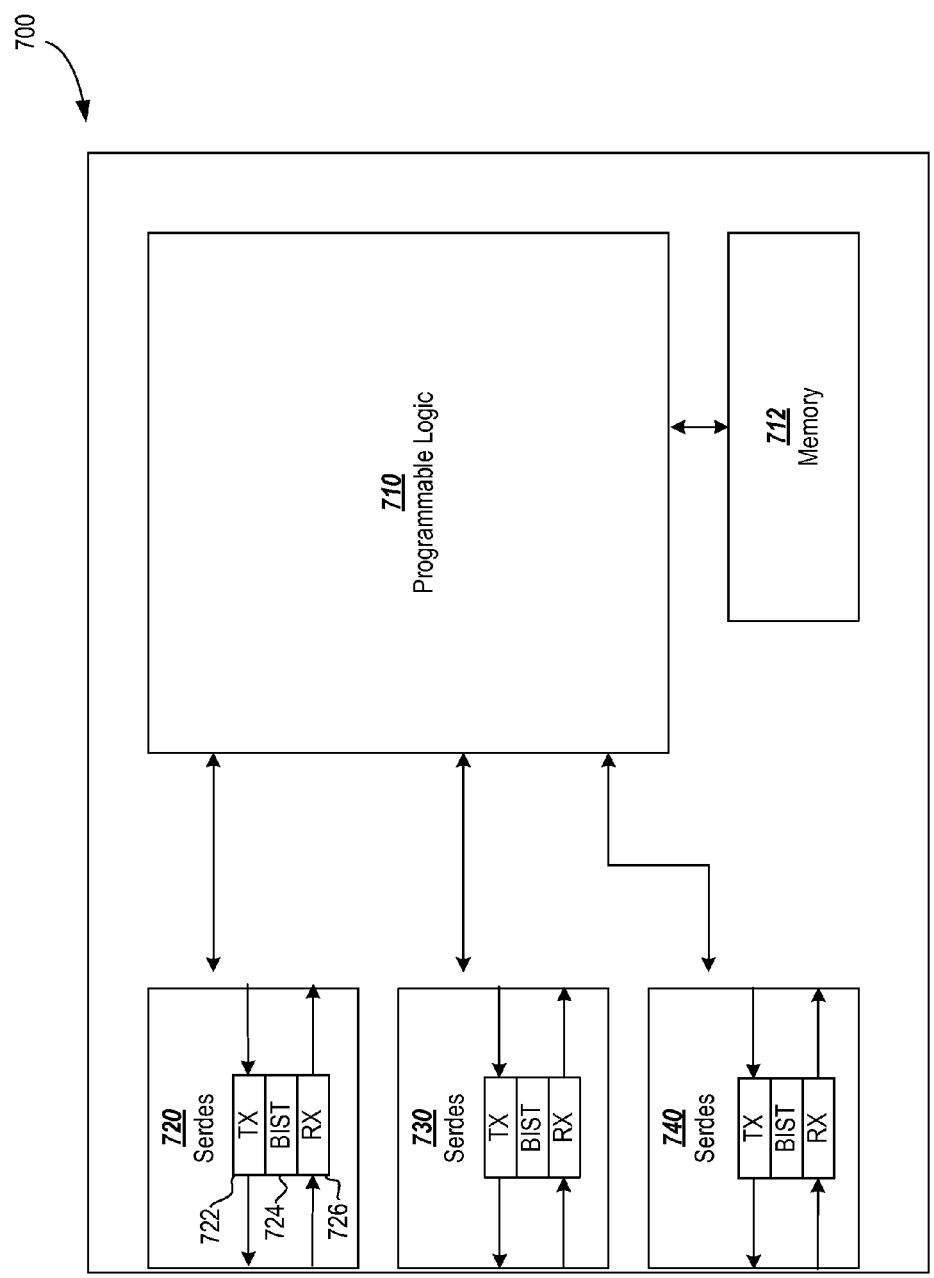
FIG. 7 shows a programmable IC having a plurality of transceivers having self-test circuits for testing jitter threshold of the transceivers.

FIG. 7 shows a programmable IC having a plurality of transceivers each having a self-test circuit for testing jitter threshold of the transceiver. In this example, programmable IC 700 includes programmable logic fabric 710, a plurality of transceivers (720, 730, and 740), and memory 712. The programmable logic fabric 710 includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The plurality of transceivers 720, 730, and 740 are connected to the programmable logic fabric and may be used thereby to communicate data to and from the programmable logic fabric 710. The transceivers 720, 730, and 740 may support the same transmission protocol or may support different transmission protocols.

Each transceiver 720, 730, and 740 includes a transmitter circuit (Tx) 722, a receiver circuit (Rx) 726, and a built-in-self-test (BIST) circuit 724. When operated in a test mode, the BIST circuit 724 configures the Tx circuit to induce jitter in a transmitted signal and enables a loopback path (not shown in FIG. 7) to provide the signal from an output of the transmitter circuit 722 to an input of the receiver circuit 726. The BIST circuit 724 monitors the receiver circuit 726 to determine whether or not the introduced jitter causes an error in the receiver circuit 726. The BIST circuit 724 may be implemented as discussed with reference to the test control circuits in FIGS. 1-6.

Figure 8:
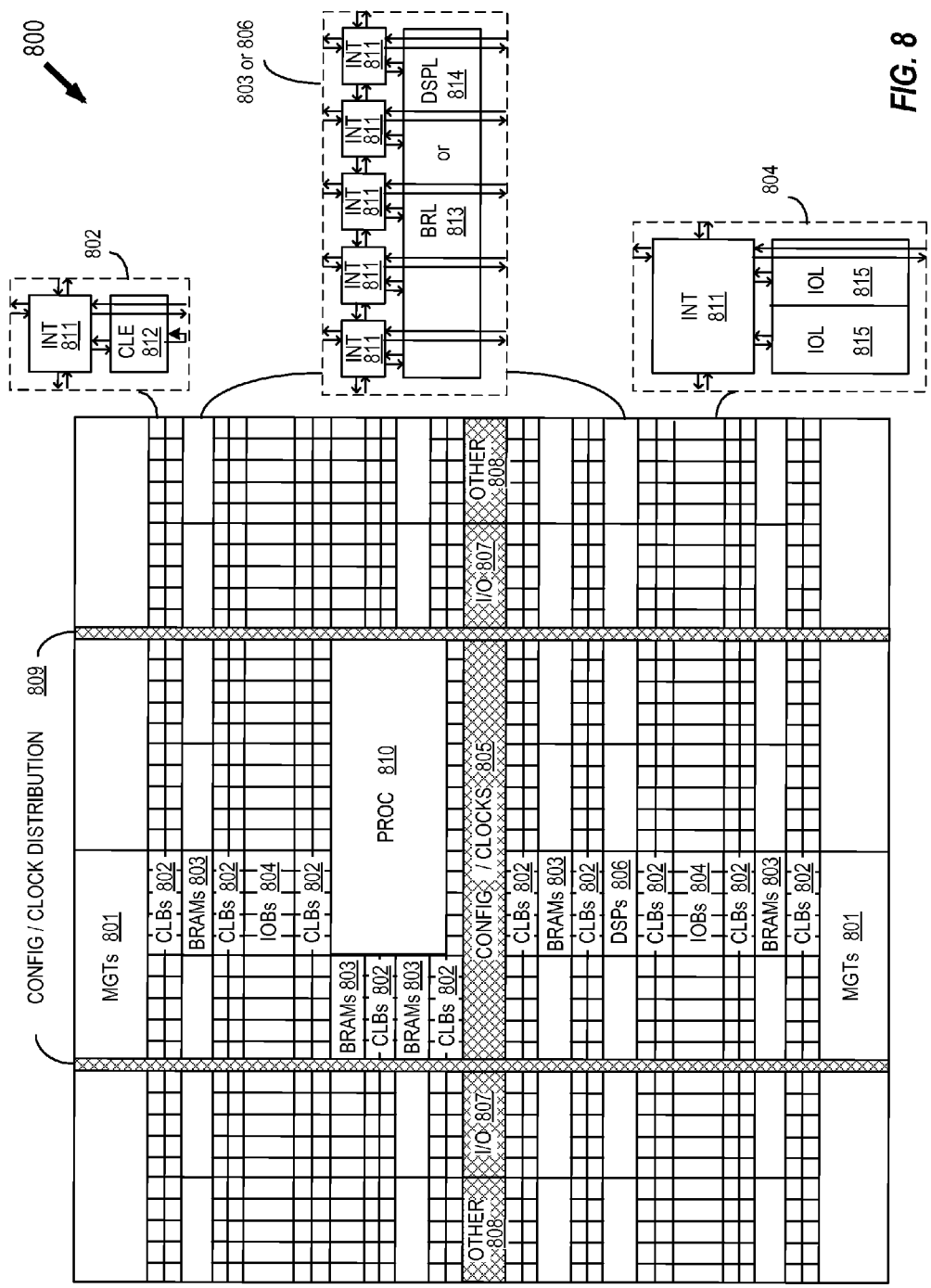
FIG. 8 shows an example programmable integrated circuit (IC).

FIG. 8 shows an example field programmable gate array (FPGA) type programmable IC that may be configured in accordance with the teachings herein. FPGAs can include several different types of programmable logic blocks in the array. For example, FIG. 8 illustrates an FPGA architecture (800) that includes a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807, for example, clock ports, and other programmable logic 808 such as digital clock managers, analog-to-digital converters, system monitoring logic, and so forth. Some FPGAs also include dedicated processor blocks (PROC) 810 and internal and external reconfiguration ports (not shown).

In some FPGAs, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic, plus a single programmable interconnect element INT 811. A BRAM 803 can include a BRAM logic element (BRL) 813 in addition to one or more programmable interconnect elements. Typically, the number of interconnect elements included in a tile depends on the height of the tile. In this example, a BRAM tile has the same height as five CLBs, but other numbers (e.g., four) can also be used. A DSP tile 806 can include a DSP logic element (DSPL) 814 in addition to an appropriate number of programmable interconnect elements. An 10B 804 can include, for example, two instances of an input/output logic element (IOL) 815 in addition to one instance of the programmable interconnect element INT 811. As will be clear to those of skill in the art, the actual I/O bond pads connected, for example, to the I/O logic element 815, are manufactured using metal layered above the various illustrated logic blocks, and typically are not confined to the area of the input/output logic element 815.

In this example, a columnar area near the center of the die (shown shaded in FIG. 8) is used for configuration, clock, and other control logic. Horizontal areas 809 extending from this column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA, more than one adjacent column of CLBs is typically included wherever the CLBs appear, to facilitate the efficient implementation of user logic.

The disclosed circuits and processes are thought to be applicable to a variety of systems for which jitter tolerance may be a concern. Other aspects and features will be apparent to those skilled in the art from consideration of the specification. For instance, though aspects and features may in some cases be described in individual figures, it will be appreciated that features from one figure can be combined with features of another figure though the combination is not explicitly shown or explicitly described as a combination. The circuits and process may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A transceiver circuit, comprising:
    an input terminal and an output terminal;
    a transmitter circuit having an output coupled to the output terminal, the transmitter including a phase interpolation circuit, a phase locked loop (PLL) circuit, and an emphasis circuit;
    a receiver circuit having an input coupled to the input terminal;
    a loopback path configured to provide a signal transmitted by the transmitter circuit on the output terminal to the input of the receiver circuit; and
    a test control circuit configured and arranged to introduce jitter in the signal transmitted by the transmitter circuit when the test control circuit is operating in a self-test mode but not when the test control circuit is operating in a non-test mode, wherein the test control circuit is configured and arranged to introduce the jitter in the signal by adjusting one or more parameters of each of the phase interpolation circuit, the PLL circuit, and the emphasis circuit.

2. The transceiver circuit of claim 1, wherein:
    the receiver circuit includes a clock and data recovery circuit; and
    the test control circuit is further configured to, when operating in the self-test mode, monitor a status of the clock and data recovery circuit to determine whether or not the jitter introduced in the signal caused an error in the clock and data recovery circuit.

3. The transceiver circuit of claim 1, wherein the test control circuit is configured to enable the loopback path when operated in the self-test mode and disable the loopback path when operated in the non-test mode.

4. The transceiver circuit of claim 1, wherein:
    the phase interpolation circuit is configured to adjust a phase of the signal transmitted by the transmitter circuit; and
    the test control circuit is configured to introduce the jitter in the signal transmitted by the transmitter circuit by adjusting one or more parameters of the phase interpolation circuit.

5. The transceiver circuit of claim 4, wherein the test control circuit is further configured to, in adjusting of the one or more parameters of the phase interpolation circuit adjust a phase shift performed by the phase interpolation circuit.

6. The transceiver circuit of claim 1, wherein:
    the emphasis circuit is configured to perform pre-emphasis or post-emphasis of the signal transmitted by the transmitter circuit; and
    the test control circuit is configured to introduce the jitter in the signal transmitted by the transmitter circuit by adjusting emphasis of the signal using the emphasis circuit.

7. The transceiver circuit of claim 1, wherein the transmitter circuit includes a phase-locked-loop (PLL); and
    the test control circuit is configured to introduce the jitter in the signal transmitted by the transmitter circuit by adjusting one or more parameters of the PLL, the parameters including: a feedback divider setting, an output divider setting, a reference divider setting, charge pump current and biases, loop filter function, and open loop gain.

8. The transceiver circuit of claim 1, further comprising
    a plurality of phase-locked-loop (PLL) circuits coupled to the transmitter circuit; and
    the test control circuit is configured and arranged to introduce the jitter in the signal transmitted by the transmitter circuit by selecting a PLL circuit from the plurality of PLL circuits and setting the transmitter circuit to use a clock from the selected PLL circuit for transmission of the signal.

9. The transceiver circuit of claim 1, wherein the test control circuit is configured and arranged to introduce the jitter in the signal transmitted by the transmitter circuit by configuring a power supply to introduce jitter in a supply voltage used to power the transmitter circuit.

10. The transceiver circuit of claim 1, wherein the jitter introduced in the signal transmitted by the transmitter circuit includes random jitter, periodic jitter, and bounded uncorrelated jitter.

11. A method of testing jitter tolerance of a transceiver, comprising:
    using a transmitter circuit of the transceiver having a phase interpolation circuit, a phase locked loop (PLL) circuit, and an emphasis circuit:
        introducing jitter in a test signal provided to an input of the transmitter circuit by adjusting one or more parameters of each of the phase interpolation circuit, the PLL circuit, and the emphasis circuit, and
        transmitting the test signal on an output of the transceiver;
    providing the test signal from the output of the transceiver to an input of the transceiver;
    using a receiver circuit of the transceiver, processing the test signal provided to the input of the transceiver; and
    monitoring the receiver circuit to determine if the introduced jitter caused an error in the processing of the test signal.

12. The method of claim 11, wherein:
    the processing of the test signal includes using a clock and data recovery circuit of the receiver circuit to recover a clock signal from the test signal; and
    the monitoring of the receiver circuit includes monitoring the clock and data recovery circuit to determine whether or not the jitter introduced in the test signal caused an error in the clock and data recovery circuit.

13. The method of claim 11, wherein:
    the transmitter circuit includes a phase interpolation circuit configured to adjust a phase of the test signal transmitted by the transmitter circuit; and
    the introducing of jitter in the test signal includes adjusting a phase shift performed by the phase interpolation circuit.

14. The method of claim 11, wherein:
the transmitter circuit includes an emphasis circuit configured to perform pre-emphasis or post-emphasis of the test signal transmitted by the transmitter circuit; and
the introducing of jitter in the test signal includes adjusting emphasis of the test signal using the emphasis circuit.

15. The method of claim 11, wherein:
the transmitter circuit includes a phase-locked-loop (PLL); and
the introducing of jitter in the test signal includes adjusting one or more of a group of parameters of the PLL, the parameters including: a feedback divider setting, an output divider setting, a reference divider setting, charge pump current and biases, loop filter function, and open loop gain.

16. The method of claim 11, wherein the introducing of jitter in the test signal includes introducing jitter in a supply voltage used to power the transmitter circuit.

17. The method of claim 11, wherein the introducing of jitter in the test signal includes introducing random jitter, periodic jitter, and bounded uncorrelated jitter.

18. The method of claim 11, wherein the introducing of jitter in a test signal introduces a first amount of jitter, and the method further comprising:
in response to determining that the introduced jitter did not cause an error in the processing of the test signal:
adjusting the transmitter to increase the amount of jitter introduced in the test signal; and
repeating the introducing, transmitting, providing, processing and monitoring steps; and
in response to determining that the introduced jitter caused an error in the processing of the test signal, outputting a data value indicating the amount of jitter the transmitter is configured to introduce in the test signal.

* * * * *